United States Patent
Messersmith et al.

(10) Patent No.: US 8,742,767 B2
(45) Date of Patent: Jun. 3, 2014

(54) PARAMETER ESTIMATION SYSTEM AND METHOD FOR AN INDUCTION MOTOR

(75) Inventors: David M. Messersmith, Kenosha, WI (US); Douglas J. Bader, Grafton, WI (US); Haihui Lu, Shanghai (CN); Thomas A. Nondahl, Wauwatosa, WI (US); Zhenhuan Yuan, Shanghai (CN)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 1237 days.

(21) Appl. No.: 12/611,719

(22) Filed: Nov. 3, 2009

(65) Prior Publication Data
US 2011/0102012 A1   May 5, 2011

(51) Int. Cl.
   *G01R 31/06*   (2006.01)
(52) U.S. Cl.
   USPC ........... 324/546; 318/811; 318/805; 318/650; 702/183; 702/189
(58) Field of Classification Search
   USPC .............. 324/379, 327, 546; 702/38; 374/152
   See application file for complete search history.

(56) References Cited

U.S. PATENT DOCUMENTS

| | | | | |
|---|---|---|---|---|
| 5,502,360 | A * | 3/1996 | Kerkman et al. | 318/805 |
| 5,689,169 | A | 11/1997 | Kerkman et al. | |
| 5,861,728 | A * | 1/1999 | Tazawa et al. | 318/778 |
| 5,929,612 | A * | 7/1999 | Eisenhaure et al. | 322/47 |
| 5,998,958 | A * | 12/1999 | Lee | 318/801 |
| 6,362,593 | B1 * | 3/2002 | Lee | 318/801 |
| 6,828,751 | B2 * | 12/2004 | Sadasivam et al. | 318/729 |
| 6,862,538 | B2 * | 3/2005 | El-Ibiary | 702/38 |
| 7,135,830 | B2 * | 11/2006 | El-Ibiary | 318/561 |
| 7,193,387 | B1 | 3/2007 | Lu et al. | |
| 7,358,700 | B2 | 4/2008 | Qian et al. | |
| 7,956,637 | B2 * | 6/2011 | Lu et al. | 324/765.01 |
| 8,010,318 | B2 * | 8/2011 | Lu et al. | 702/182 |
| 2009/0052308 | A1 * | 2/2009 | Tabor et al. | 369/244.1 |
| 2010/0194329 | A1 * | 8/2010 | Lu et al. | 318/798 |

* cited by examiner

*Primary Examiner* — Richard Isla Rodas
(74) *Attorney, Agent, or Firm* — Fletcher Yoder, P.C.

(57) ABSTRACT

A method of estimating stator resistance of an induction motor includes applying voltage pulses through two phase paths of the motor for a plurality of electrical cycles to inject current in the motor, wherein the voltage pulses are applied until rotor flux of the motor is substantially stabilized and measuring stator voltage and stator current in response to the applied voltage pulses for each of the plurality of electrical cycles. The method also includes calculating the stator resistance based upon the measured stator voltages and the stator currents.

20 Claims, 6 Drawing Sheets

PARAMETER ESTIMATION SYSTEM AND METHOD FOR AN INDUCTION MOTOR

BACKGROUND

The invention relates generally to induction motors, and particularly to a parameter estimation system for estimating parameters of induction motors.

Induction motors have broad applications in the industry. Typically, motor control systems are employed to control different aspects of applications in which electric motors drive loads. Various types of motor control systems and algorithms are known and are in use to control operation of the motors. Examples of such control algorithms include sensorless speed control, torque based control and preset slow speed control of the motor.

Each of these control methods requires information of the motor parameters. For example, speed control of a motor connected to a smart motor controller (SMC) requires speed information of the motor. Similarly, the torque based control requires an estimate of stator resistance of the motor for calculating a torque estimate. Unfortunately, none of the existing systems provide information about all the parameters of the motor.

Accordingly, it would be desirable to develop a parameter estimation system that provides information related to complete set of parameters of an induction motor driven by a smart motor controller.

BRIEF DESCRIPTION

Briefly, according to one embodiment of the present invention, a method of estimating stator resistance of an induction motor is provided. The method includes applying voltage pulses through two phase paths of the motor for a plurality of electrical cycles to inject current in the motor, wherein the voltage pulses are applied until rotor flux of the motor is substantially stabilized, and measuring stator voltage and stator current in response to the applied voltage pulses for each of the plurality of electrical cycles. The method also includes calculating the stator resistance based upon the measured stator voltages and the stator currents.

In accordance with another aspect, a method of estimating a coupling factor of a rotor of an induction motor is provided. The method includes applying voltage pulses through two phase paths of the motor for a plurality of electrical cycles over a stabilization period, and measuring stator voltage and stator current in response to the applied voltage pulses for each of the plurality of electrical cycles. The method also includes calculating first and second fluxes using the measured stator voltage and stator current based upon stator and rotor equations, and estimating the coupling factor through the stabilization period by using the first and second fluxes.

In accordance with another aspect, a method of estimating leakage inductance of an induction motor is provided. The method includes starting the motor and measuring currents and voltages for three phase paths of the motor, and calculating a first flux using the measured currents and voltages in accordance with stator equations. The method also includes calculating a second flux using the measured currents and voltages and an estimated rotor speed in accordance with rotor equations, and estimating the leakage inductance using the first and second fluxes when the rotor speed estimate is less than a threshold speed.

In accordance with another aspect, a parameter estimation system for an induction motor is provided. The parameter estimation system includes an input power line, a rectifier and a controller disposed between the input power line and the induction motor to be characterized, the controller configured to trigger the rectifier to apply voltage pulses to the motor, and to estimate at least one of a total resistance, a stator resistance, a total leakage inductance and a coupling factor of the motor based upon measured currents and voltages in response to the applied voltage pulses.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present technique function to provide a parameter estimation system for estimating parameters of an induction motor. In particular, the present technique provides off-line and on-line estimation process for estimating a variety of parameters for a motor driven by a SMC which are required for a sensorless control of the motor.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
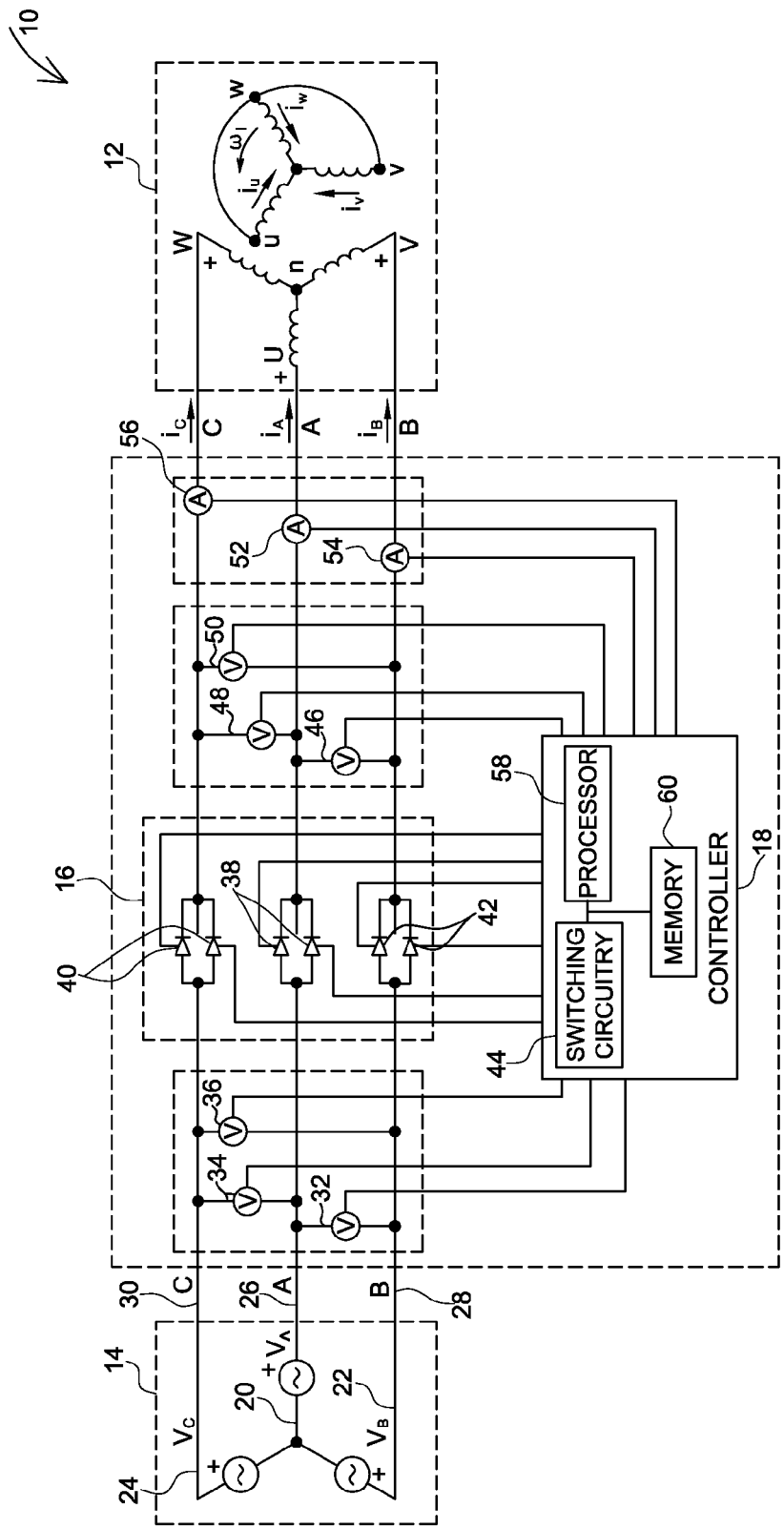
FIG. 1 illustrates a parameter estimation system for an induction motor in accordance with aspects of the present invention.

Turning now to drawings and referring first to FIG. 1, a parameter estimation system 10 for an induction motor 12 is illustrated. The parameter estimation system 10 includes an input power line 14 and a rectifier 16. The system 10 further includes a controller 18 disposed between the input power line 14 and the induction motor 12. The induction motor 12 can be either Y-connected or delta-connected. The controller 18 is configured to trigger the rectifier 16 to apply voltage pulses to the motor 12 and to estimate parameters such as total resistance, stator resistance, total leakage resistance and a coupling factor based upon measured currents and voltages in response to the applied voltage pulses. Such estimated parameters may subsequently be utilized for controlling the motor 12.

In the illustrated embodiment, the input power line 14 includes a three phase power supply that outputs three voltages generally represented by reference numerals 20, 22 and 24. However, other configurations of the input power line 14 with different numbers of phases and waveforms may be envisaged. In operation, voltage pulses 20, 22 and 24 are applied to the motor 12 through phase paths 26, 28 and 30 respectively. In an exemplary embodiment, the system 10 includes voltage sensors 32, 34 and 36 coupled to the phase paths 26, 28 and 30 to measure input line-to-line voltages among the phase paths 26, 28 and 30. It should be noted that a more or fewer numbers of sensors may be employed to measure the voltages among the phase paths 26, 28 and 30.

In this exemplary embodiment, the rectifier 16 may include a plurality of switching devices such as solid-state switches, or thyristors, or SCR pairs such as represented by reference numerals 38, 40 and 42 to regulate currents through the phase paths 26, 28 and 30. The operation of such switching devices 38, 40 and 42 is controlled by a switching circuitry 44 of the controller 18. As will be appreciated by one skilled in the art, a plurality of other switching devices may be employed to regulate the currents through the phase paths 26, 28 and 30. For example, an insulated gate bi polar transistor (IGBT) may be employed as the switching device.

Further, voltage sensors such as represented by reference numerals 46, 48 and 50 may be employed between the rectifier 16 and the motor 12 to measure line-to-line voltages between each of the phase paths 26, 28 and 30. The controller 18 may utilize such measured voltages from the sensors 46, 48 and 50 to estimate the parameters of the motor. Furthermore, such measured voltages may also be utilized to control the operation of the rectifier 16 and the motor 12. Again, in certain configurations, lesser number of such sensors may be sufficient to measure the line-to-line voltages.

Further, the system 10 includes current sensors 52, 54 and 56 to measure currents in each of the phase paths 26, 28 and 30. In certain embodiments, the system 10 may include less number of current sensors. The measured currents are utilized by the controller 18 to estimate parameters of the motor 12 and for controlling operation of the motor 12 based upon such estimated parameters. In the illustrated embodiment, the controller 18 includes a processor 58 to estimate the motor parameters from the measured voltages and currents. Further, the controller 18 also includes a memory 60 to store the estimated parameters. The memory 60 may include hard disk drives, optical drives, tape drives, random access memory (RAM), read-only memory (ROM), programmable read-only memory (PROM), redundant arrays of independent disks (RAID), flash memory, magneto-optical memory, holographic memory, bubble memory, magnetic drum, memory stick, Mylar® tape, smartdisk, thin film memory, zip drive, and so forth.

It should be noted that the present invention is not limited to any particular processor for performing the processing tasks of the invention. The term "processor," as that term is used herein, is intended to denote any machine capable of performing the calculations, or computations, necessary to perform the tasks of the invention. The term "processor" is intended to denote any machine that is capable of accepting a structured input and of processing the input in accordance with prescribed rules to produce an output. It should also be noted that the phrase "configured to" as used herein means that the processor is equipped with a combination of hardware and software for performing the tasks of the invention, as will be understood by those skilled in the art.

In one exemplary embodiment, the controller 18 is configured to trigger the switches of the rectifier 16 to apply a single voltage pulse to two phase paths of the motor 12 and to estimate the total resistance and the total leakage inductance based upon the measured motor terminal voltages and stator currents while the rectifier 16 is conducting. In another exemplary embodiment, the controller 18 is configured to trigger the switches of the rectifier to apply voltage pulses to two phase paths of the motor 12 for a plurality of electrical cycles until a rotor flux of the motor 12 is stabilized and to calculate the stator resistance based upon the measured stator voltages and the stator currents for each of the plurality of electrical cycles.

In another embodiment, the controller 18 is configured to trigger the switches of the rectifier 16 to apply voltage pulses through two phase paths of the motor for a plurality of electrical cycles over a pre-determined stabilization period and to estimate first and second fluxes using measured stator voltage and stator current in accordance with stator and rotor equations. Further, the controller 18 is configured to estimate the coupling factor through the stabilization period by using the estimated first and second fluxes.

In another exemplary embodiment, the controller 18 is configured to start the motor at a pre-determined rotor speed and measure currents and voltages. Further the controller 18 is configured to estimate first and second fluxes using the measured currents and voltages in accordance with stator and rotor equations respectively and to estimate the leakage inductance using the first and second fluxes when the rotor speed estimate is less than a threshold speed. The estimation of these parameters via the parameter estimation system 10 will be described in a greater detail below with reference to FIGS. 2-6.

Figure 2:
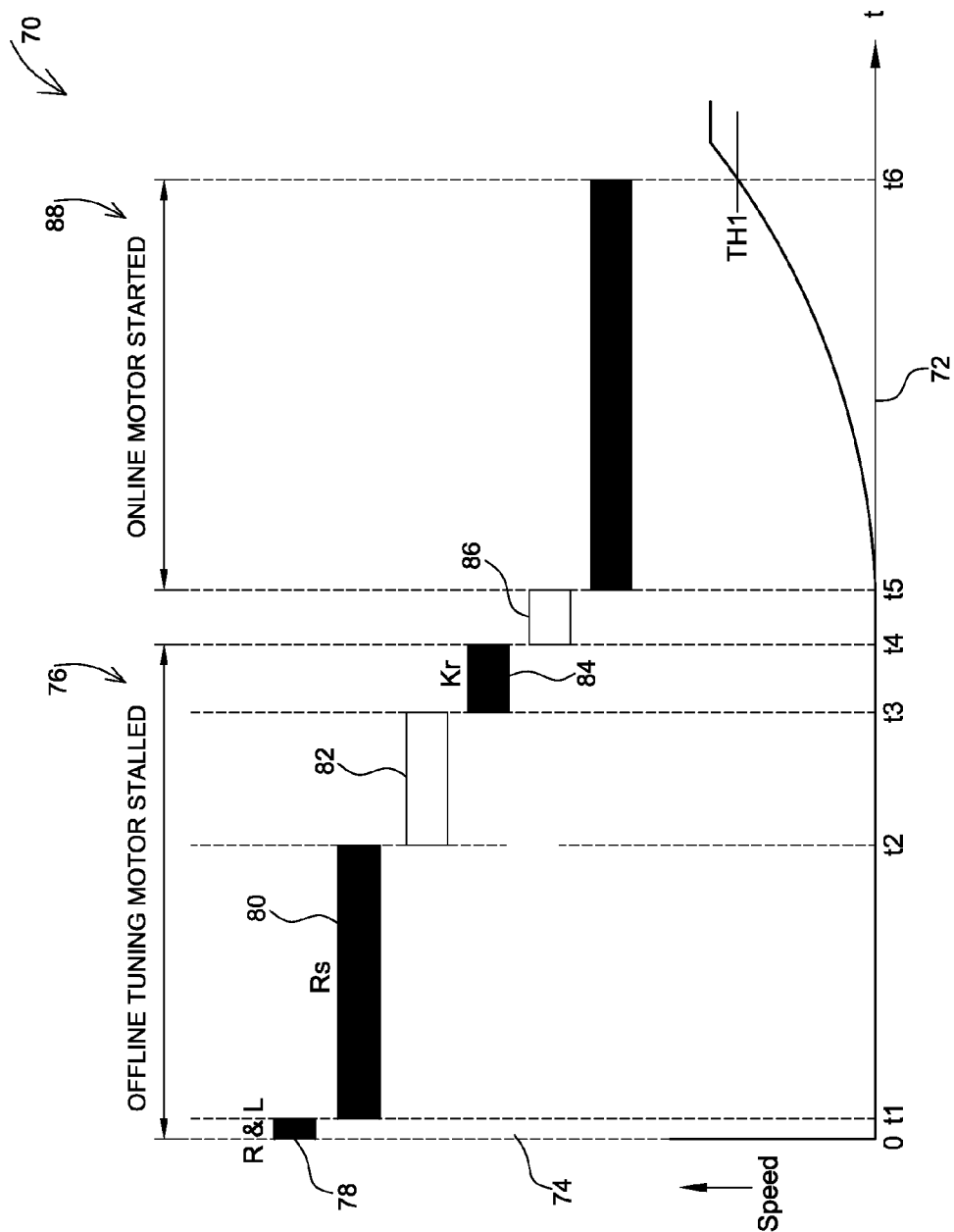
FIG. 2 illustrates an exemplary timing diagram for estimation of motor parameters using parameter estimation system of FIG. 1.

FIG. 2 illustrates an exemplary timing diagram 70 for estimation of motor parameters using parameter estimation system 10 of FIG. 1. In this embodiment, the abscissa axis 72 represents time and the ordinate axis 74 represents speed of the induction motor 12. As illustrated, parameters such as total resistance R, total leakage inductance L, stator resistance $R_s$ and the coupling factor $K_r$ are estimated when the induction motor is stalled, as represented by reference numeral 76. In this embodiment, the total resistance is estimated in accordance with the following relationship:

$$R = R_s + K_r^2 R_r \tag{1}$$

where: $R_s$ is the stator resistance; $R_r$ is the rotor resistance; and $K_r$ is the coupling factor.

Further, total leakage inductance L is estimated in accordance with the following relationship:

$$L = \sigma L_s \tag{2}$$

where: $L_s$ is the self inductance of stator;
and $\sigma \approx 1 - K_r^2$.

Moreover, the coupling factor $K_r$ is estimated in accordance with the following relationship:

$$K_r = L_m / L_r \tag{3}$$

where: $L_m$ is the mutual inductance; and
$L_r$ is the self inductance of rotor.

After estimation of the total resistance R, total leakage inductance L and the stator resistance $R_s$ (represented by reference numeral 78 and 80), the motor is demagnetized until the rotor flux becomes zero, as represented by reference numeral 82. Subsequently, the coupling factor $K_r$ is estimated by applying voltage pulses through two phase paths of the motor 12, as represented by reference numeral 84. Then, the motor 12 is again demagnetized, as represented by reference numeral 86 and the motor 12 is started to on-line adapt the total leakage inductance L while the motor 12 is running. The estimation of each of these parameters total resistance R, total leakage inductance L, stator resistance $R_s$ and the coupling factor $K_r$ will be described below with reference to FIGS. 3-6.

Figure 3:
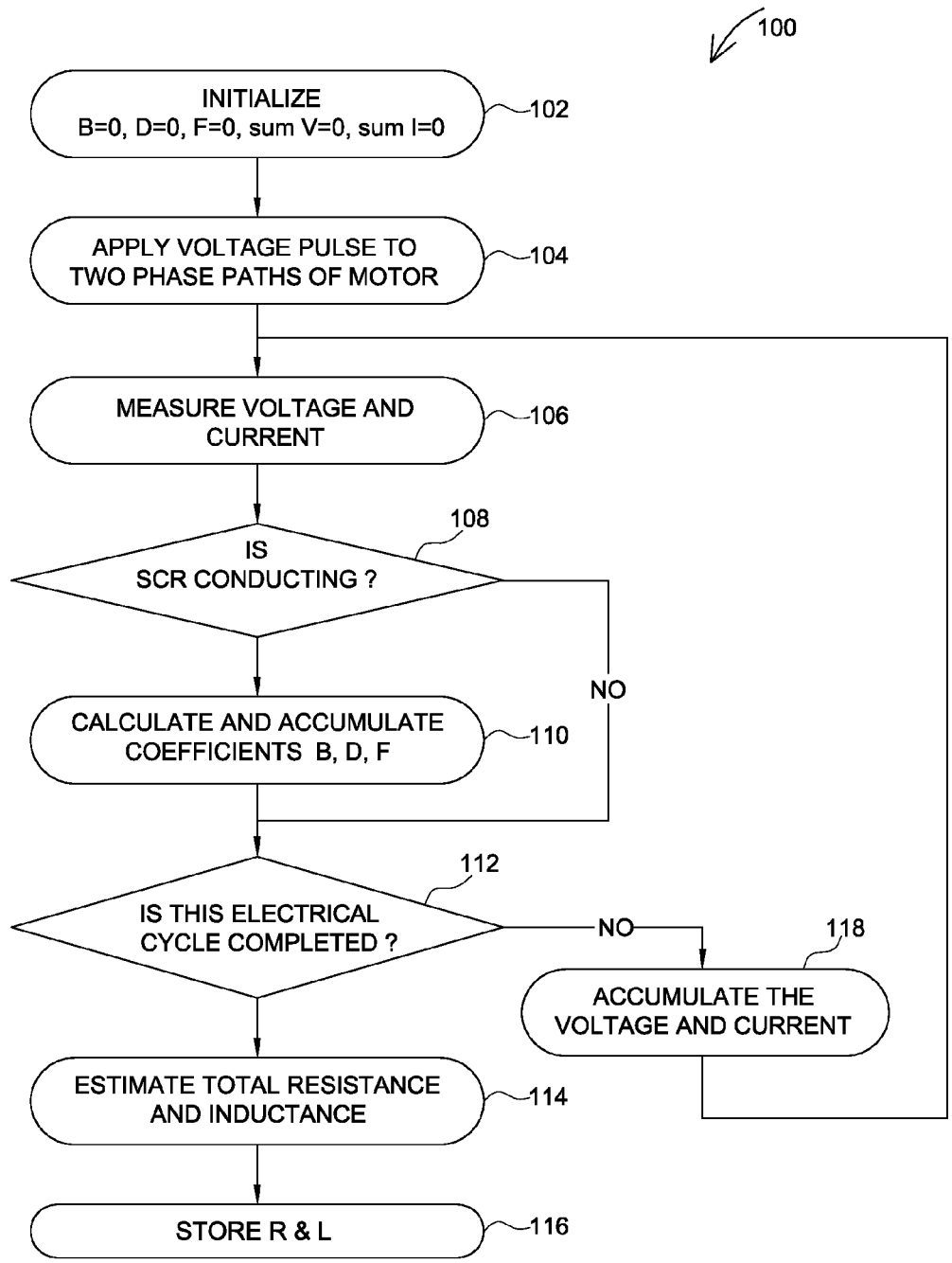
FIG. 3 illustrates an exemplary method of estimating total resistance R and total leakage inductance L of the induction motor of FIG. 1.

FIG. 3 illustrates an exemplary method 100 of estimating total resistance R and total leakage inductance L of the induction motor 12 of FIG. 1. In this exemplary embodiment, the total resistance R is estimated in accordance with the following relationship:

$$R = \frac{\sum_{k=1}^{200} V_{qk}}{\sum_{k=1}^{200} I_{qk}} \quad (4)$$

where: $V_{qk}$ is the measured voltage on applying single firing pulse to two motor phases; and $I_{qk}$ is the measured current on applying single firing pulse to two motor phases. Here, the sampling frequency is about 10 Hz and the power supply is about 50 Hz. Thus, about 200 datapoints correspond to one cycle of the power supply. Once R is obtained as described above, total inductance L may be estimated using a curve fitting technique, in accordance with the following relationship:

$$L = \frac{1}{D}(F - R*B) \quad (5)$$

$$\text{where: } B = \sum_{k=0}^{N} \left( i_{Qk} \frac{di_{Qk}}{dt} \right) \quad (6)$$

$$D = \sum_{k=0}^{N} \left( \frac{di_{Qk}}{dt} \right)^2 \quad (7)$$

$$F = \sum_{k=0}^{N} \left( \frac{di_{Qk}}{dt} u_{Qk} \right). \quad (8)$$

At block 102, the process is initialized and the three coefficients B, D and F along with sum V and sum I are set to zero. Subsequently, a single firing pulse is applied to two motor phases of the induction motor (block 104). In this exemplary embodiment, the firing pulse is applied to phases b and c of the induction motor. However, any two motor phases may be triggered for this operation. Next, voltage $V_{bc}$ and current $I_b$ are measured and stored, as represented by block 106. At block 108, it is verified if the SCR is conducting. If the switches of the rectifier are conducting, then the system calculates and accumulates coefficients B, D and F in accordance with relationships (6), (7) and (8) described above (block 110). Once the coefficients are stored, the system checks if the electrical cycle is completed (block 112).

On completion of the electrical cycle, the total resistance and inductance is estimated using the accumulated currents, voltages and the coefficients in accordance with relationships (4) and (5) described above (block 114) and these values are stored in a memory, as represented by block 116. Alternatively, if the electrical cycle is not completed, the system continues to accumulate voltages and currents in response to the firing pulses, as represented by reference numeral 118 until the cycle is completed and the parameters total resistance and total inductance can be estimated.

Further, at block 108, if the system verifies that switch is not conducting, then it is directed to block 112 to check if the electrical cycle is completed. Again, if the electrical cycle is completed, the parameters total resistance and total inductance are estimated and stored, as represented by reference numerals 114 and 116. Alternatively, if the electrical cycle is not completed, the system continues to accumulate voltages and currents in response to the firing pulses, as represented by reference numeral 118 until the cycle is completed and the parameters total resistance and total inductance can be estimated. The method described above provides substantially accurate results for the total resistance and total inductance values.

Figure 4:
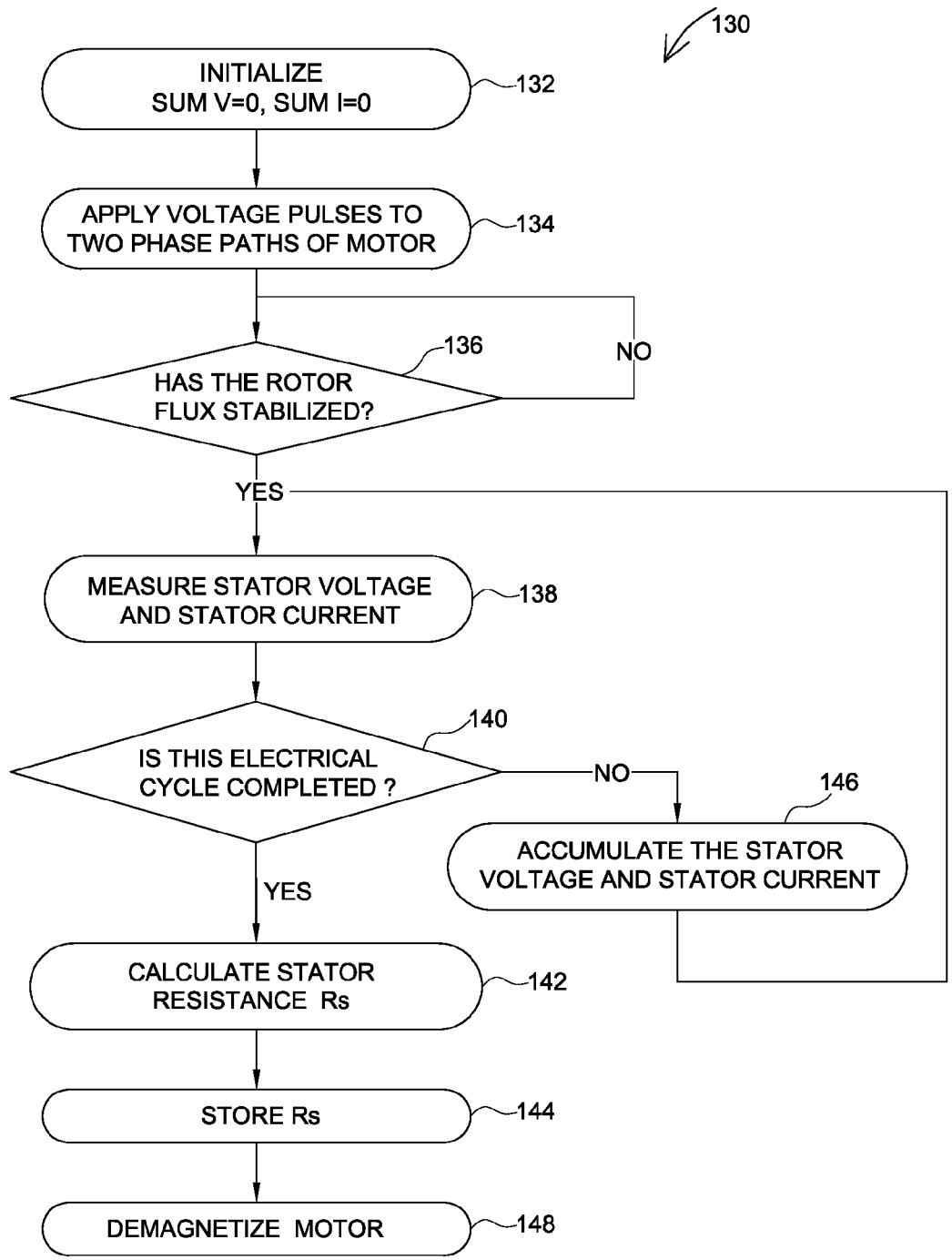
FIG. 4 illustrates an exemplary method of estimating stator resistance Rs of the induction motor of FIG. 1.

FIG. 4 illustrates an exemplary method 130 of estimating stator resistance $R_s$ of the induction motor 12 of FIG. 1. At block 132, the process is initialized and each of the stator voltage and the stator current sum V and sum I is set to zero. At block 134, voltage pulses are applied to stator windings of two phase paths of the motor for a plurality of electrical cycles. In this exemplary embodiment, the voltage pulses are applied to phases b and c of the induction motor. In the illustrated embodiment, the number of electrical cycles is determined by the following relationship:

$$N = \frac{L}{R} \left| c / T_{power_{supply}} \right. \quad (9)$$

where: L is the total inductance determined using the process of FIG. 3;
R is the total resistance determined using the process of FIG. 3;
$T_{power\_supply}$ is the period of power supply; and
c is a constant to ensure that time duration is larger than the rotor time constant. In one exemplary embodiment, the constant c is between about 200 to about 400. In this embodiment, the number of electrical cycles N is selected to stabilize the rotor flux of the motor. Thus, the voltage pulses are applied to the motor to inject current until the rotor flux is substantially stabilized.

Further, at block 136, if the N cycles for rotor flux stabilization are completed, then stator current and stator voltage are measured in response to the applied voltage pulses (block 138). At block 140, if the electrical cycle is completed, then the stator resistance is calculated based upon the measured stator current and stator voltage in accordance with the following relationship (block 142):

$$R_S = \frac{\text{Sum } V}{\text{Sum } I}. \quad (10)$$

Such estimated stator resistance $R_s$ is then stored in a memory, as represented by block 144. If the electrical cycle is not complete, the system continues to accumulate the stator voltage and the stator current (block 146) and estimates the stator resistance from such accumulated values once the electrical cycle is completed. Once the stator resistance is estimated, the induction motor may be demagnetized, as represented by reference numeral 148. In one exemplary embodiment, the motor is demagnetized by applying voltage pulses in a reverse polarity. In an alternate embodiment, the motor is demagnetized by stopping the application of voltage pulses for a pre-determined number of electrical cycles. In this embodiment, the application of the voltage pulses may be stopped for a time period that is at least about 3 to about 5 times the firing period.

Figure 5:
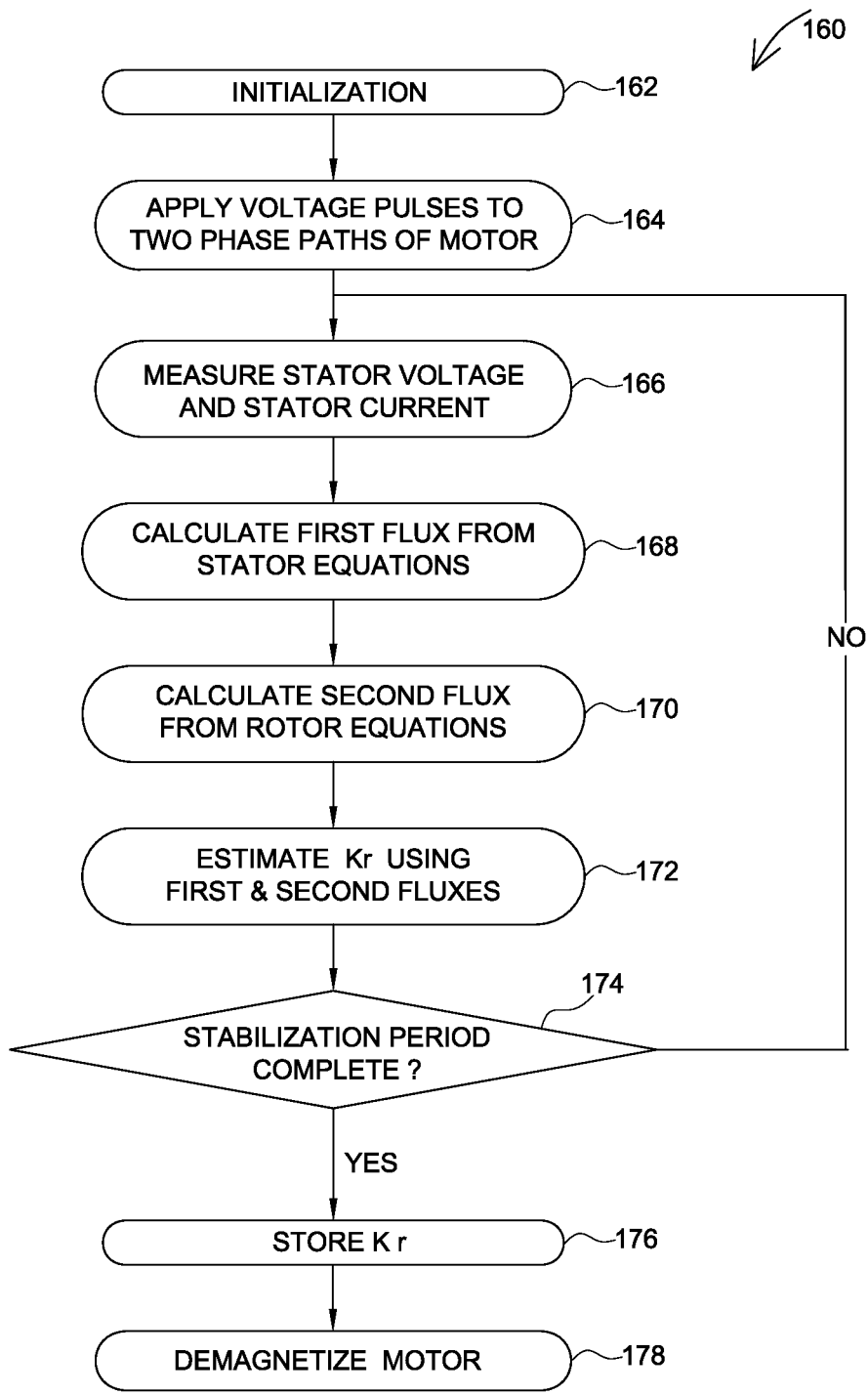
FIG. 5 illustrates an exemplary method of estimating coupling factor Kr of the induction motor of FIG. 1.

FIG. 5 illustrates an exemplary method 160 of estimating coupling factor $K_r$ of the induction motor 12 of FIG. 1. At block 162, the process is initialized and voltage pulses are applied to two phase paths of the induction motor (block 164). In this exemplary embodiment, the voltage pulses are applied for a plurality of electrical cycles over a pre-determined stabilization period. In one embodiment, the stabilization period is selected such that the application of voltage pulses for estimating the coupling factor lasts for between about 0.5 secs to about 2 secs. At block 168, a first flux is calculated using the measured stator voltage and current based upon stator equations. In this embodiment, the first flux is calculated in accordance with the following relationship:

$$\varphi_{rq_1} = (K_r \varphi_{rq_v}) \frac{s}{s+w_{c1}} = (u_Q - R_s i_Q) \frac{1}{s+w_{c1}} - L i_Q \frac{s}{s+w_{c1}}. \quad (11)$$

At block 170, a second flux is calculated using the measured stator current based upon rotor equations. In this embodiment, the second flux is calculated in accordance with the following relationship:

$$\varphi_{rq_2} = (K_r \varphi_{rq_c}) \frac{s}{s+w_{c1}} = \left( K_r \frac{L_m * i_Q}{T_r s + 1} \right) \frac{s}{s+w_{c1}}. \quad (12)$$

Further, at block 172, the coupling factor is estimated through the stabilization period using the first and second fluxes. In this exemplary embodiment, the coupling factor is estimated in accordance with the following relationship:

$$K_r = (\varphi_{rq_1} - \varphi_{rq_2}) \left( k_p + \frac{k_i}{s} \right). \quad (13)$$

The equation (13) is solved to obtain a converged estimate of the coupling factor. In this exemplary embodiment, the coupling factor is adjusted to minimize a difference between the first and second fluxes, wherein the coupling factor is adjusted as a parameter in the rotor equations while using the stator equations as a reference model. In certain embodiments, high-pass filtering is applied to the stator and rotor equations to reduce the impact of offsets in the measured voltages and currents.

Moreover, once the stabilization period is completed (block 174), the value of the coupling factor is stored in a memory, as represented in block 176. At block 178, the induction motor is demagnetized. Again, the motor may be demagnetized by applying voltage pulses in a reverse polarity or by stopping the application of voltage pulses for a pre-determined number of electrical cycles. In this embodiment, the application of the voltage pulses may be stopped for a time period that is at least about 3 to about 5 times the firing period.

Figure 6:
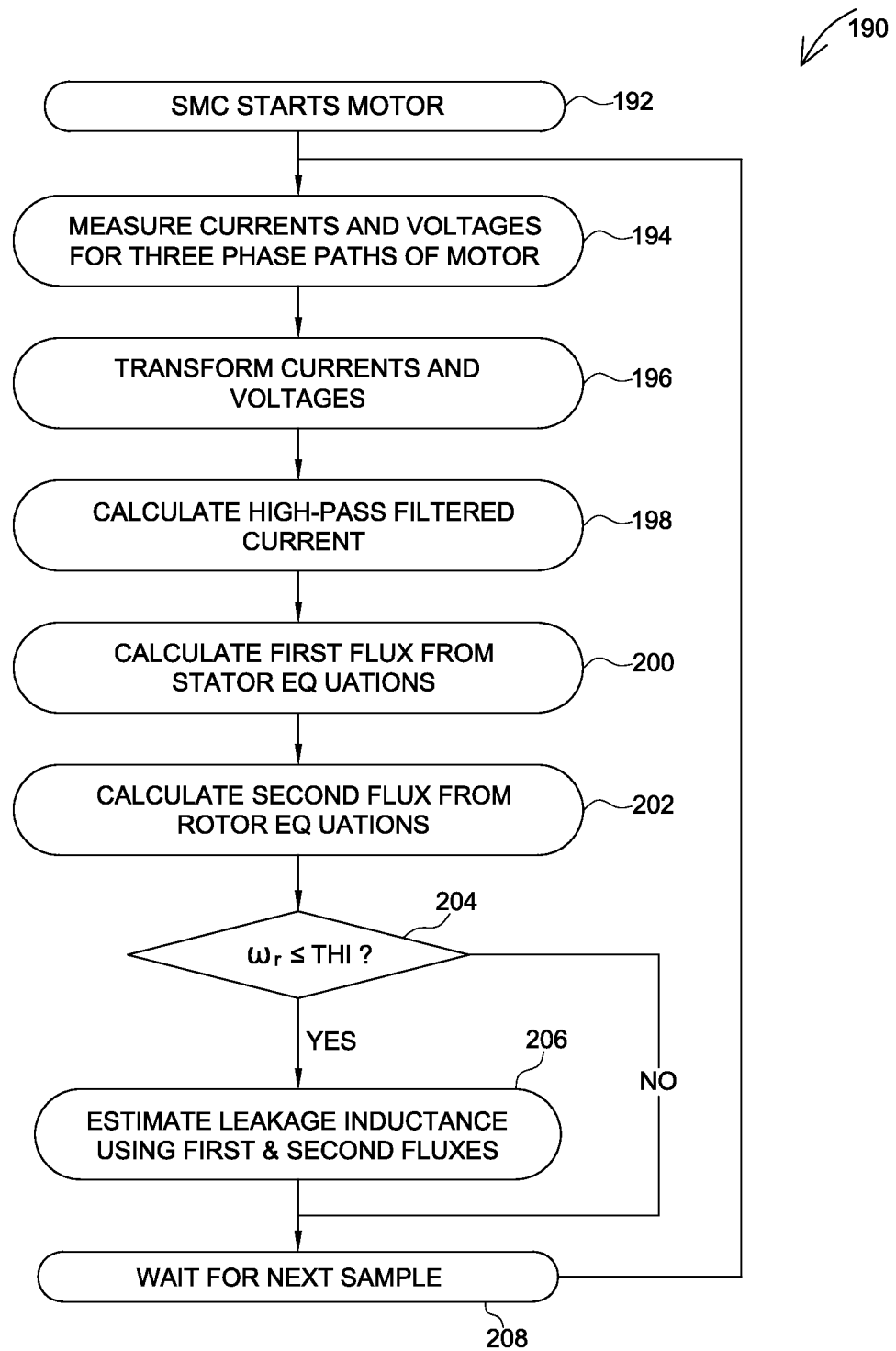
FIG. 6 illustrates an exemplary method of estimating leakage inductance L of the induction motor of FIG. 1.

FIG. 6 illustrates an exemplary method 190 of estimating leakage inductance L of the induction motor 12 of FIG. 1. The leakage inductance changes as a function of the rotor frequency of the induction motor. Therefore, in the illustrated embodiment, the leakage inductance is estimated when the SMC starts the motor, as represented by block 192. It should be noted that the initial value of the leakage inductance is set to the value estimated using the process of FIG. 3. At block 194, the currents and voltages are measured for three phase paths of the induction motor. Further, the measured currents and voltages are transformed to obtain d-axis and q-axis components (block 196). The transformation of the voltages and currents is represented by the following relationships:

$$\begin{bmatrix} V_d \\ V_q \end{bmatrix} = \frac{2}{3} \begin{bmatrix} V_a - \left(\frac{1}{2} V_b\right) - \left(\frac{1}{2} V_c\right) \\ \frac{\sqrt{3}}{2} V_b - \frac{\sqrt{3}}{2} V_c \end{bmatrix} \quad (14)$$

$$\begin{bmatrix} i_d \\ i_q \end{bmatrix} = \frac{2}{3} \begin{bmatrix} I_a - \left(\frac{1}{2} I_b\right) - \left(\frac{1}{2} I_c\right) \\ \frac{\sqrt{3}}{2} I_b - \frac{\sqrt{3}}{2} I_c \end{bmatrix}. \quad (15)$$

At block 198, high-pass filtered current components are calculated. In this embodiment, high-pass filter is applied to reduce the impact of offsets in the measured currents and voltages. The high-pass filtered current components are calculated in accordance with the following relationship:

$$i_{d1} = i_d \frac{s}{s+w_{c1}} \quad (16)$$

$$i_{q1} = i_q \frac{s}{s+w_{c1}}. \quad (17)$$

At block 200, first flux is calculated using measured currents and voltages in accordance with stator equations. The d-axis and q-axis components of the first flux are calculated in accordance with the following relationships:

$$i_{d1} = i_d \frac{s}{s+w_{c1}} \varphi_{rd1} = (v_d - R_s i_d) \frac{1}{s+\omega_{c1}} - L i_{d1} \quad (18)$$

$$\varphi_{rq1} = (v_q - R_s i_q) \frac{1}{s+\omega_{c1}} - L i_{q1} \quad (19)$$

$$i_{q1} = i_q \frac{s}{s+w_{c1}}.$$

At block 202, second flux is calculated using measured currents and voltages in accordance with rotor equations. The d-axis and q-axis components of the second flux are calculated in accordance with the following relationships:

$$s\varphi_{rd_2} = -\frac{1}{T} \varphi_{rd_2} - w_r \varphi_{rq_2} + K_r^2 R_r i_{d_1} \quad (20)$$

$$s\varphi_{rq_2} = +\frac{1}{T} \varphi_{rq_2} + w_r \varphi_{rd_2} + K_r^2 R_r i_{q_1}. \quad (21)$$

Further, at block 204, rotor speed is compared with a threshold speed. If the rotor speed is less than the threshold speed, the leakage inductance is estimated using the first and second fluxes (block 206).

In this exemplary embodiment, the leakage inductance is adjusted to minimize a difference between the first and second fluxes. In particular, the leakage inductance is adjusted as a parameter in the stator equations while using the rotor equations as a reference model. The cross product of the first and second fluxes is used to drive a proportional-integral (PI) regulator to estimate the leakage inductance. The cross product of the first and second fluxes is estimated in accordance with the following relationship:

$$e_2 = \phi_{rd2}\phi_{rq1} - \phi_{rq2}\phi_{rd1} \quad (22).$$

Furthermore, the leakage inductance is estimated in accordance with the following relationship:

$$L = e_2\left(k_{pL} + \frac{k_{iL}}{s}\right). \quad (23)$$

In one embodiment, if the rotor speed is greater than the threshold speed, then the systems waits for the next sample (block 208) and proceeds to block 194 for measuring currents and voltages for the next sample.

As will be appreciated by those of ordinary skill in the art, the foregoing example, demonstrations, and process steps may be implemented by suitable code on a processor-based system, such as a general-purpose or special-purpose computer. It should also be noted that different implementations of the present technique may perform some or all of the steps described herein in different orders or substantially concurrently, that is, in parallel. Furthermore, the functions may be implemented in a variety of programming languages, such as C++ or JAVA. Such code, as will be appreciated by those of ordinary skill in the art, may be stored or adapted for storage on one or more tangible, machine readable media, such as on memory chips, local or remote hard disks, optical disks (e.g., CD's or DVD's), or other media, which may be accessed by a processor-based system to execute the stored code. Note that the tangible media may comprise paper or another suitable medium upon which the instructions are printed. For instance, the instructions can be electronically captured via optical scanning of the paper or other medium, then compiled, interpreted or otherwise processed in a suitable manner if necessary, and then stored in a computer memory.

The various aspects of the structures described hereinabove may be used for estimating parameters of an induction motor. In particular, the present technique provides off-line and on-line estimation process for estimating a variety of parameters for a motor driven by a SMC which are required for a sensorless control of the motor. Further, such estimated parameters also provide information about temperature and health status of the motor. As described above, the parameters such as total resistance R, total leakage inductance L, stator resistance Rs and the coupling factor Kr are estimated using off-line process when the induction motor is stalled. Further, the leakage inductance L is adapted using on-line process while the motor is running.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of estimating stator resistance of an induction motor, comprising:
    applying voltage pulses through only two phase paths of the motor for a plurality of electrical cycles to inject current into the motor, wherein the voltage pulses are applied at least until rotor flux of the motor is substantially stabilized;
    measuring stator voltage and stator current in response to the applied voltage pulses for each of the plurality of electrical cycles; and
    calculating the stator resistance based upon the measured stator voltages and the stator currents.

2. The method of claim 1, wherein measuring stator voltage and stator current comprises measuring the stator voltage and stator current for each of the plurality of electrical cycles after the rotor flux of the motor is substantially stabilized.

3. The method of claim 1, wherein calculating the stator resistance comprises estimating the stator resistance based upon accumulated stator voltages and stator currents, wherein the accumulated stator voltages and stator currents are accumulated for the plurality of electrical cycles after the rotor flux of the motor is substantially stabilized.

4. The method of claim 1, wherein calculating the stator resistance comprises estimating the stator resistance based upon stored stator voltages and stator currents for the electrical cycle with stabilized rotor flux.

5. The method of claim 1, further comprising estimating a number of electrical cycles for stabilizing the rotor flux, wherein the number of electrical cycles is based upon an estimated total resistance and an estimated total leakage inductance of the motor.

6. The method of claim 5, wherein the number of electrical cycles is based upon a time period of the power supply to the motor and a constant selected such that the number of electrical cycles is relatively greater than a rotor time constant.

7. The method of claim 1, further comprising:
    storing the calculated stator resistance; and
    demagnetizing the motor by applying voltage pulses in a reverse polarity, or by stopping the application of voltage pulses for a pre-determined number of electrical cycles.

8. A method of estimating stator resistance of an induction motor, comprising:
    estimating a number of electrical cycles for stabilizing the rotor flux, wherein the number of electrical cycles is based upon an estimated total resistance and an estimated total leakage inductance of the motor;
    applying voltage pulses through two phase paths of the motor for the number of electrical cycles estimated to inject current into the motor;
    measuring stator voltage and stator current in response to the applied voltage pulses for each of the plurality of electrical cycles; and
    calculating the stator resistance based upon the measured stator voltages and the stator currents.

9. The method of claim 8, wherein measuring stator voltage and stator current comprises measuring the stator voltage and stator current for each of the plurality of electrical cycles after the rotor flux of the motor is substantially stabilized.

10. The method of claim 8, wherein calculating the stator resistance comprises estimating the stator resistance based upon accumulated stator voltages and stator currents, wherein the accumulated stator voltages and stator currents are accumulated for the plurality of electrical cycles after the rotor flux of the motor is substantially stabilized.

11. The method of claim 8, wherein calculating the stator resistance comprises estimating the stator resistance based upon stored stator voltages and stator currents for the electrical cycle with stabilized rotor flux.

12. The method of claim 8, wherein the number of electrical cycles is based upon a time period of the power supply to the motor and a constant selected such that the number of electrical cycles is relatively greater than a rotor time constant.

13. The method of claim 8, further comprising:
    storing the calculated stator resistance; and demagnetizing the motor by applying voltage pulses in a reverse polarity, or by stopping the application of voltage pulses for a pre-determined number of electrical cycles.

14. A method of estimating stator resistance of an induction motor, comprising:

estimating a number of electrical cycles for stabilizing the rotor flux, wherein the number of electrical cycles is based upon an estimated total resistance and an estimated total leakage inductance of the motor;

applying voltage pulses through only two phase paths of the motor for the number of electrical cycles estimated to inject current into the motor;

measuring stator voltage and stator current in response to the applied voltage pulses for each of the plurality of electrical cycles; and calculating the stator resistance based upon the measured stator voltages and the stator currents.

15. The method of claim 14, wherein applying voltage pulses through only two phase paths of the motor comprises applying voltage pulses through phase b and phase c.

16. The method of claim 14, wherein measuring stator voltage and stator current comprises measuring the stator voltage and stator current for each of the plurality of electrical cycles after the rotor flux of the motor is substantially stabilized.

17. The method of claim 14, wherein calculating the stator resistance comprises estimating the stator resistance based upon accumulated stator voltages and stator currents, wherein the accumulated stator voltages and stator currents are accumulated for the plurality of electrical cycles after the rotor flux of the motor is substantially stabilized.

18. The method of claim 14, wherein calculating the stator resistance comprises estimating the stator resistance based upon stored stator voltages and stator currents for the electrical cycle with stabilized rotor flux.

19. The method of claim 14, wherein the number of electrical cycles is based upon a time period of the power supply to the motor and a constant selected such that the number of electrical cycles is relatively greater than a rotor time constant.

20. The method of claim 14, further comprising:

storing the calculated stator resistance; and demagnetizing the motor by applying voltage pulses in a reverse polarity, or by stopping the application of voltage pulses for a pre-determined number of electrical cycles.

* * * * *